US012422607B2

(12) United States Patent
Gui et al.

(10) Patent No.: US 12,422,607 B2
(45) Date of Patent: Sep. 23, 2025

(54) DISPLAY MODULE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Lihao Gui, Wuhan (CN); Kuihua You, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 401 days.

(21) Appl. No.: 17/779,766

(22) PCT Filed: Mar. 28, 2022

(86) PCT No.: PCT/CN2022/083361
§ 371 (c)(1),
(2) Date: May 25, 2022

(87) PCT Pub. No.: WO2023/173474
PCT Pub. Date: Sep. 21, 2023

(65) Prior Publication Data
US 2023/0296819 A1    Sep. 21, 2023

(30) Foreign Application Priority Data
Mar. 16, 2022  (CN) .......................... 202210256861.0

(51) Int. Cl.
*G02B 5/20*  (2006.01)
*G02B 5/30*  (2006.01)
(Continued)

(52) U.S. Cl.
CPC ................. *G02B 5/30* (2013.01); *G02B 5/20* (2013.01); *G02F 1/133512* (2013.01); *H10K 59/38* (2023.02); *G02F 1/133331* (2021.01)

(58) Field of Classification Search
CPC ....... G02B 5/20; G02B 5/30; G02F 1/133331; G02F 1/133528; G02F 2202/28; G02F 1/133512; G02F 1/133385; H10K 59/38
See application file for complete search history.

(56) References Cited

U.S. PATENT DOCUMENTS

2012/0106063 A1* 5/2012 Mathew ................ G06F 1/1626
349/110
2015/0131035 A1* 5/2015 Chen .................. G02F 1/133533
427/163.1

(Continued)

FOREIGN PATENT DOCUMENTS

CN    106680925 A      5/2017
CN    109164648 A  *  1/2019  ....... G02F 1/133502
(Continued)

OTHER PUBLICATIONS

PCT International Search Report for International Application No. PCT/CN2022/083361, mailed on Jun. 27, 2022, 10pp.
(Continued)

*Primary Examiner* — Alexander P Gross
(74) *Attorney, Agent, or Firm* — PV IP PC; Wei Te Chung

(57) ABSTRACT

The present application provides a display module and a display device. The display module is provided with optical transparent resin in a first via hole of a polarizing layer, and the optical transparent resin is cured after a cover plate and the polarizing layer are attached to each other. In this way, the via hole of the polarizing layer is fully filled using the optical transparent resin in a fluid state before cured, pre- (Continued)

venting a display panel from collapsing due to a void in the via hole.

8 Claims, 5 Drawing Sheets

(51) Int. Cl.
    *G02F 1/1335*     (2006.01)
    *H10K 59/38*     (2023.01)
    *G02F 1/1333*     (2006.01)

(56) References Cited

U.S. PATENT DOCUMENTS

| | | | |
|---|---|---|---|
| 2021/0311241 A1* | 10/2021 | Chai | G02B 5/003 |
| 2021/0376003 A1* | 12/2021 | Xu | G06F 3/0445 |
| 2022/0020969 A1* | 1/2022 | Choi | H10K 59/8791 |
| 2022/0158138 A1* | 5/2022 | Chai | H10K 59/8723 |
| 2022/0344426 A1* | 10/2022 | Wang | H10K 59/8794 |

FOREIGN PATENT DOCUMENTS

| | | | | |
|---|---|---|---|---|
| CN | 110133788 A | | 8/2019 | |
| CN | 110133902 A | | 8/2019 | |
| CN | 110456543 A | | 11/2019 | |
| CN | 110471499 A | | 11/2019 | |
| CN | 111026288 A | * | 4/2020 | ........... G06F 3/0412 |
| CN | 111145646 A | * | 5/2020 | ............. G09F 9/301 |
| CN | 111308771 A | * | 6/2020 | ......... G02F 1/13338 |
| CN | 111929759 A | | 11/2020 | |
| CN | 112635535 A | | 4/2021 | |
| CN | 112666758 A | | 4/2021 | |
| CN | 213092064 U | | 4/2021 | |
| CN | 113192976 A | | 7/2021 | |
| CN | 213661672 U | * | 7/2021 | |
| CN | 109307962 B | * | 8/2021 | ....... G02F 1/133512 |
| CN | 113241361 A | | 8/2021 | |
| CN | 214042890 U | | 8/2021 | |
| JP | 2005292238 A | | 10/2005 | |
| WO | WO-2021153930 A1 | * | 8/2021 | ............... G02B 1/14 |
| WO | WO-2021213049 A1 | * | 10/2021 | ........... H10K 50/844 |

OTHER PUBLICATIONS

PCT Written Opinion of the International Search Authority for International Application No. PCT/CN2022/083361, mailed on Jun. 27, 2022, 7pp.

Chinese Office Action issued in corresponding Chinese Patent Application No. 202210256861.0 dated Apr. 27, 2023, pp. 1-8, 20pp.

* cited by examiner

DISPLAY MODULE AND DISPLAY DEVICE

CROSS REFERENCE TO RELATED APPLICATIONS

This application is a National Phase of PCT Patent Application No. PCT/CN2022/083361 having International filing date of Mar. 28, 2022, which claims the benefit of priority of Chinese Patent Application No. 202210256861.0, filed Mar. 16, 2022, the contents of which are all incorporated herein by reference in their entirety.

FIELD OF THE DISCLOSURE

The present application relates to display panel technologies, and more particularly to a display module and a display device.

DESCRIPTION OF RELATED ARTS

With the development of display technologies, front camera is placed under a display panel and realized by drilling a hole through a display device in order to increase screen ratio. Compared to a use of through hole, blind hole is widely used because it can achieve smaller aperture and smaller bezel. For the blind hole technique, polarizing sheet is processed in order to improve light transmittance. This includes two approaches. One is to bake the polarizing sheet at the position of the blind hole to remove the polarizing property of the polarizing sheet. However, this approach will cause the polarizing sheet to have poor weather resistance and lead to yellowing at the baking position and a decrease in light transmittance, and this affects camera effect. The other approach is to drill through a part of the polarizing sheet at the position of the blind hole and cover it with optical clear adhesive (OCA). However, because the OCA has high elastic modulus, there will be a void above the display panel such that the display panel will not be well supported and thus collapse and deformation occurs on the display panel.

Therefore, the existing display device has a technical problem of collapse and deformation of the display panel, caused when a void exists at the position of the blind hole.

Technical Problems

Embodiments of the present application provide a display module and a display device, for solving the technical problem of collapse and deformation of a display panel, caused when an existing display device has a blind hole design and a void exists in the blind hole.

Technical Solutions

To solve above problems, the technical solutions provided in the present application are described below.

An embodiment of the present application provides a display module, including:
a backplate;
a display panel, disposed at a side of the backplate;
a polarizing layer, disposed at a side of the display panel away from the backplate; and
a cover plate, disposed at a side of the polarizing layer away from the display panel,
wherein the display module includes a normal display area and an electronic component disposing area corresponding to a location where an electronic component is disposed, the polarizing layer forms a first via hole in the electronic component disposing area, the first via hole is provided with optical transparent resin, and the optical transparent resin is cured after the cover plate and the polarizing layer are attached to each other.

In some embodiments, the display module further includes an adhering layer, wherein the adhering layer is disposed between the polarizing layer and the cover plate and covers the optical transparent resin.

In some embodiments, a material of the adhering layer includes optical adhesive, and the optical transparent resin is cured after the optical adhesive and the cover plate are attached to each other.

In some embodiments, the optical transparent resin extends from being on the polarizing layer to being in the first via hole of the polarizing layer, and a projection of the optical transparent resin onto the display panel overlaps with a projection of the polarizing layer onto the display panel, and the optical transparent resin is cured after the cover plate is attached to the optical transparent resin.

In some embodiments, the polarizing layer includes a polarizing sheet, the polarizing sheet forms the first via hole, the optical transparent resin covers the polarizing sheet and extends to being in the first via hole of the polarizing sheet, and a surface that the cover plate contacts with the optical transparent resin is a plane.

In some embodiments, the polarizing layer includes color resist units and black matrix units, the color resist units are disposed between the black matrix units, and in an area close to the electronic component disposing area, the black matrix units are disposed at a side of the color resist units close to the first via hole.

In some embodiments, the cover plate includes a cover plate body and an ink layer, the ink layer is disposed between the cover plate body and the polarizing layer, and the ink layer forms a second via hole in the electronic component disposing area.

In some embodiments, a symmetrical axis of the second via hole is as same as a symmetrical axis of the first via hole, and a width of the second via hole is less than a width of the first via hole.

In some embodiments, the polarizing layer includes color resist units and black matrix units, the color resist units are disposed between the black matrix units, and a gap exists between a projection of the color resist units onto the display panel and a projection of the ink layer onto the display panel.

Embodiments of the present application also provides a display device, which includes a display module and an electronic component. The display module includes:
a backplate;
a display panel, disposed at a side of the backplate;
a polarizing layer, disposed at a side of the display panel away from the backplate; and
a cover plate, disposed at a side of the polarizing layer away from the display panel,
wherein the display module includes a normal display area and an electronic component disposing area corresponding to a location where an electronic component is disposed, the polarizing layer forms a first via hole in the electronic component disposing area, the first via hole is provided with optical transparent resin, and the optical transparent resin is cured after the cover plate and the polarizing layer are attached to each other.

In some embodiments, the display module further includes an adhering layer, wherein the adhering layer is disposed between the polarizing layer and the cover plate and covers the optical transparent resin.

In some embodiments, a material of the adhering layer includes optical adhesive, and the optical transparent resin is cured after the optical adhesive and the cover plate are attached to each other.

In some embodiments, the optical transparent resin extends from being on the polarizing layer to being in the first via hole of the polarizing layer, and a projection of the optical transparent resin onto the display panel overlaps with a projection of the polarizing layer onto the display panel, and the optical transparent resin is cured after the cover plate is attached to the optical transparent resin.

In some embodiments, the polarizing layer includes a polarizing sheet, the polarizing sheet forms the first via hole, the optical transparent resin covers the polarizing sheet and extends to being in the first via hole of the polarizing sheet, and a surface that the cover plate contacts with the optical transparent resin is a plane.

In some embodiments, the polarizing layer includes color resist units and black matrix units, the color resist units are disposed between the black matrix units, and in an area close to the electronic component disposing area, the black matrix units are disposed at a side of the color resist units close to the first via hole.

In some embodiments, the cover plate includes a cover plate body and an ink layer, the ink layer is disposed between the cover plate body and the polarizing layer, and the ink layer forms a second via hole in the electronic component disposing area.

In some embodiments, a symmetrical axis of the second via hole is as same as a symmetrical axis of the first via hole, and a width of the second via hole is less than a width of the first via hole.

In some embodiments, the polarizing layer includes color resist units and black matrix units, the color resist units are disposed between the black matrix units, and a gap exists between a projection of the color resist units onto the display panel and a projection of the ink layer onto the display panel.

In some embodiments, the display module further includes a complex layer, and the complex layer is disposed at a side of the backplate away from the display panel.

In some embodiments, the complex layer is provided with a third via hole in the electronic component disposing area, and a width of the third via hole is greater than a width of the first via hole.

Beneficial Effects

The present application provides a display module and a display device. The display module includes a backplate, a display panel, a polarizing layer and a cover plate. The display panel is disposed at a side of the backplate. The polarizing layer is disposed at a side of the display panel away from the backplate. The cover plate is disposed at a side of the polarizing layer away from the display panel. The display module includes a normal display area and an electronic component disposing area corresponding to a location where an electronic component is disposed. The polarizing layer forms a first via hole in the electronic component disposing area. The first via hole is provided with optical transparent resin, and the optical transparent resin is cured after the cover plate and the polarizing layer are attached to each other. In the present application, the optical transparent resin is disposed in the first via hole of the polarizing layer, and the optical transparent resin is cured after a cover plate and the polarizing layer are attached to each other. In this way, the via hole of the polarizing layer is fully filled using the optical transparent resin in a fluid state before cured, preventing the display panel from collapsing due to a void in the via hole.

DESCRIPTION OF EMBODIMENTS OF THE DISCLOSURE

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

Figure 1:
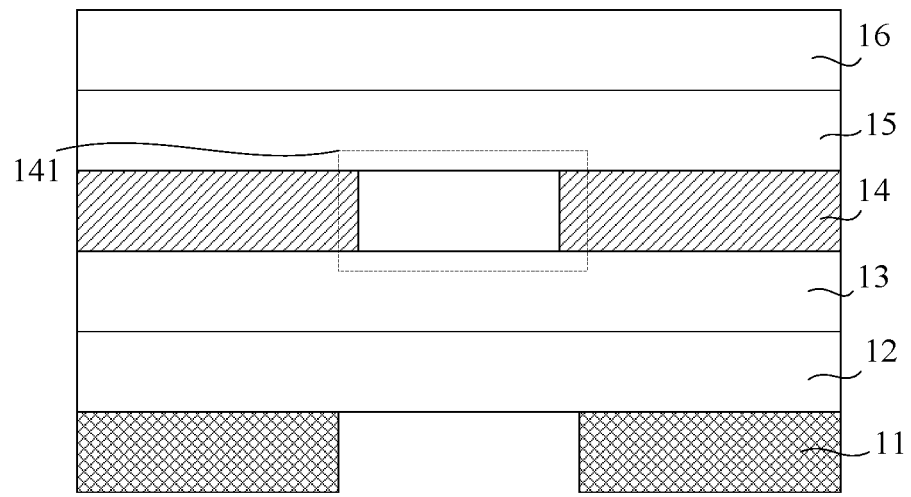
FIG. 1 is a schematic diagram illustrating a first type of existing display device.
Figure 2:
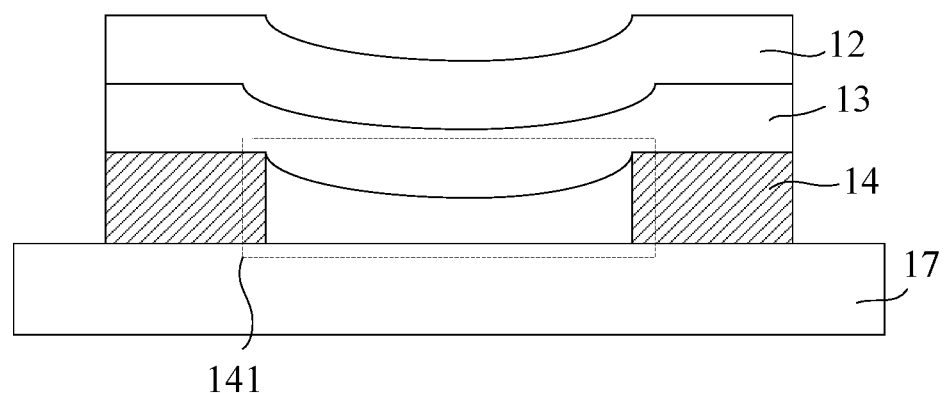
FIG. 2 is a schematic diagram illustrating a second type of existing display device.

As shown in FIG. 1, an existing display device includes a complex layer 11, a backplate 12, a display panel 13, a polarizing sheet 14, optical adhesive 15 and a cover plate 16. In a manufacturing process of the display device, the polarizing sheet 14 is drilled at the position of a blind hole to obtain an opening 141 such that light transmittance increases in the area of the blind hole. Then, the polarizing sheet 14 is attached to the optical adhesive 15. However, since the optical adhesive has higher elastic modulus, it has weak ability to overcome segment difference. This causes a void formed above the display panel. The display panel cannot be well supported. As shown in FIG. 2, when other film layers are attached to a substrate 17, it will cause the display panel 13 and the backplate 12 to bend automatically by gravity. Collapse and deformation occur on the display panel 13 and the base plate 12. This causes the display panel not to perform well and camera effect may be affected. Therefore, the existing display device has a technical problem of collapse and deformation of the display panel, caused when a void exists at the position of the blind hole.

The embodiments of the present application provide a display module and a display device to solve above technical problem.

Figure 3:
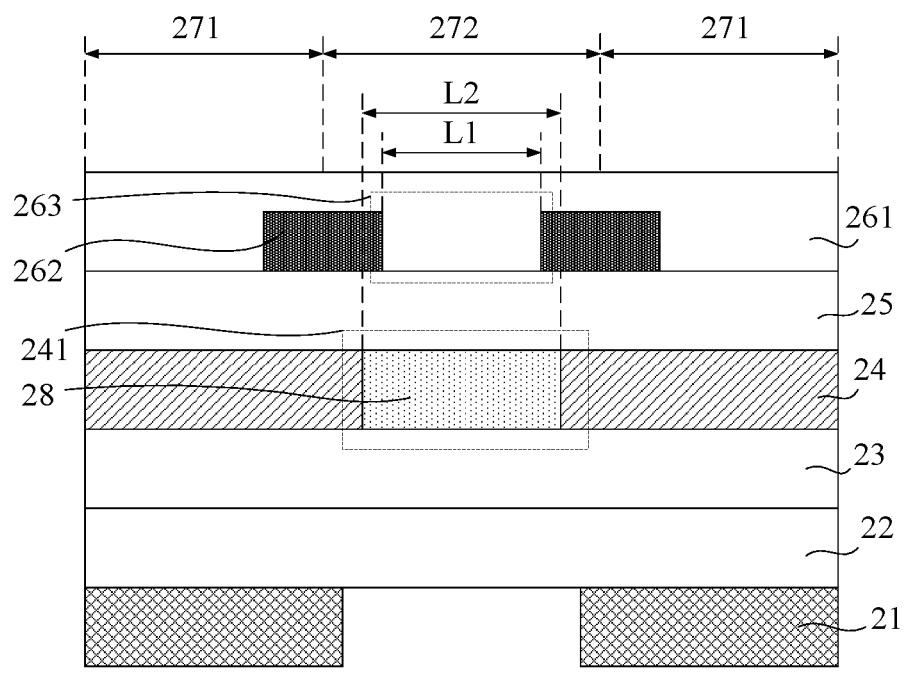
FIG. 3 is a schematic diagram illustrating a first type of a display module provided in an embodiment of the present application.

As shown in FIG. 3, an embodiment of the present application provides a display module. The display module 2 includes:

a backplate 22;
a display panel 23, disposed at a side of the backplate 22;
a polarizing layer 24, disposed at a side of the display panel 23 away from the backplate 22; and
a cover plate 26, disposed at a side of the polarizing layer 24 away from the display panel 23, wherein the display module 2 includes a normal display area 271 and an electronic component disposing area 272 corresponding to a location where an electronic component is disposed, the polarizing layer 24 forms a first via hole 241 in the electronic component disposing area 272, the first via hole 241 is provided with optical transparent resin 28, and the optical transparent resin 28 is cured after the cover plate 26 and the polarizing layer 24 are attached to each other.

The embodiment of the present application provides a display module. The display module is provided with the optical transparent resin in the first via hole of the polarizing layer, and the optical transparent resin is cured after the cover plate and the polarizing layer are attached to each other. In this way, the via hole of the polarizing layer is fully filled using the optical transparent resin in a fluid state before cured, preventing the display panel from collapsing due to a void in the via hole.

When an adhering layer is disposed on the polarizing layer, there will have a void in the via hole of the polarizing layer, which causes the display panel unable to be supported. In an embodiment, as shown in FIG. 3, the display module 2 further includes an adhering layer 25, wherein the adhering layer 25 is disposed between the polarizing layer 24 and the cover plate 26 and covers the optical transparent resin 28. By disposing the adhering layer between the polarizing layer and the cover plate, the adhering layer can make the cover plate adhere to the polarizing layer to prevent the cover plate from falling off. By filling the first via hole of the polarizing layer with the optical transparent resin, the display panel can thus be supported after filling with the optical transparent resin, preventing the display panel from having a depression. In addition, the adhering layer is disposed on the optical transparent resin such that the adhering layer can be disposed on the polarizing layer evenly. The display module can be smoother after the cover plate is attached to the adhering layer.

In an embodiment, a material of the adhering layer includes optical adhesive, and the optical transparent resin is cured after the optical adhesive and the cover plate are attached to each other. In a case that the adhering layer is optical adhesive, since the optical adhesive has higher elastic modulus and thus segment difference cannot be overcome, this causes a void formed above the display panel and thus the display panel cannot be well supported. In the present application, the optical transparent resin is filled into the first via hole of the polarizing layer, and the optical transparent resin is cured after the optical adhesive and the cover plate are attached to each other. In this way, the first via hole of the polarizing layer can be filled fully by the optical transparent resin such that there is no void in the first via hole of the polarizing layer. By using the optical transparent resin to support the display panel, the display panel is prevented from being curved to have poor performance.

It needs to be noted that since the optical transparent resin will be cured after the optical adhesive and the cover plate are attached to each other and a certain degree of contraction will happen in the process of transitioning from a fluid state to a solid state for any material, it may appear a certain number of small holes or gaps after the optical transparent resin is cured. However, because the first via hole of the polarizing layer is filled with the optical transparent resin, it can support the display panel. Therefore, it can solve the problem of the present application, that is, a void causes a bending display panel. In addition, the display panel and the optical adhesive have a certain degree of stiffness. Therefore, a small number of small holes or gaps may not cause the display panel or the optical adhesive to be bent.

In an embodiment, a material of the adhering layer includes optical adhesive, and the optical transparent resin is cured after the optical adhesive and the cover plate are attached to each other. The optical transparent resin extends from the first via hole to being on the polarizing layer, and the thickness of the optical transparent resin located on the polarizing layer is a tenth to a twentieth of the thickness of the optical transparent resin within the via hole. By extending the optical transparent resin to being on the polarizing layer and controlling the thickness of the optical transparent resin to be smaller, the optical transparent resin located on the polarizing layer can fill up small holes or gaps within the via hole when the optical transparent resin within the via hole of the polarizing layer contracts as it is cured. Since the optical transparent resin on the polarizing layer has smaller thickness, it has less impact on the flatness of the optical adhesive such that the optical transparent resin can fully fill up the via hole of the polarizing layer and support the display panel and meanwhile the flatness of the optical adhesive and the cover plate is not affected.

Figure 4:
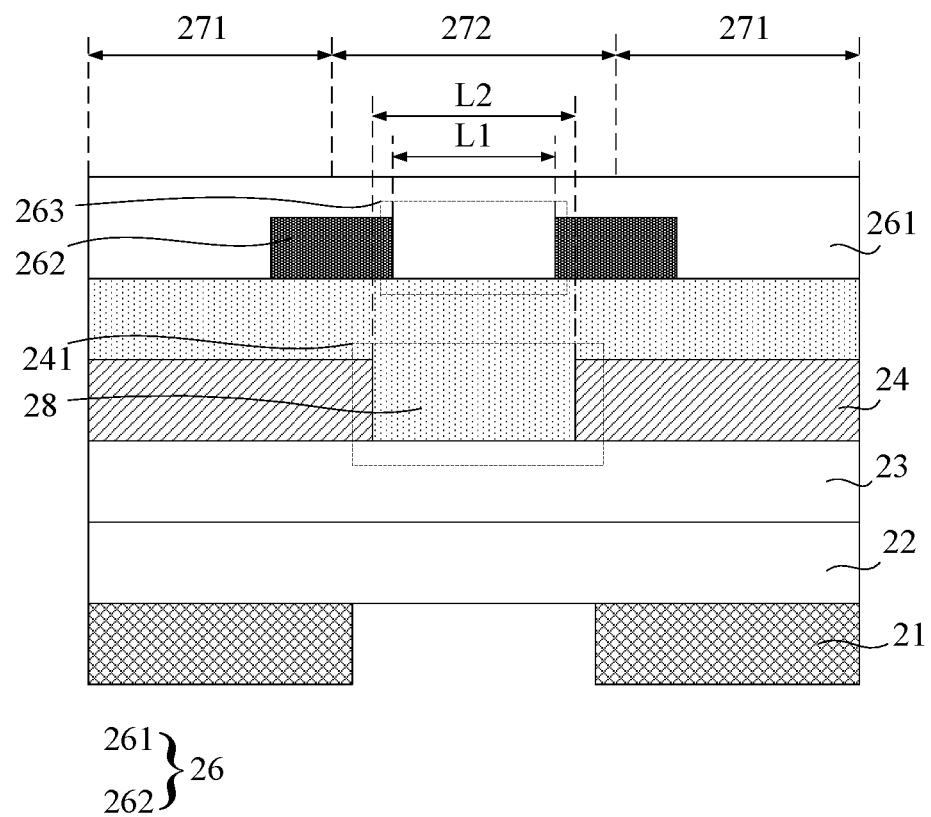
FIG. 4 is a schematic diagram illustrating a second type of a display module provided in an embodiment of the present application.

The contraction of the optical transparent resin as it is cured causes small holes or gaps to appear in the via hole of the polarizing layer. In an embodiment, as shown in FIG. 4, the optical transparent resin 28 extends from being on the polarizing layer 24 to being in the first via hole 241 of the polarizing layer 24, and a projection of the optical transparent resin 28 onto the display panel 23 overlaps with a projection of the polarizing layer 24 onto the display panel 23, and the optical transparent resin 28 is cured after the cover plate 26 is attached to the optical transparent resin 28. During deployment of the optical transparent resin, the optical transparent resin continues to form on the polarizing layer after the optical transparent resin is disposed in the first via hole. By the optical transparent resin, the cover plate and the polarizing layer are adhered to each other. The function of the adhering layer is achieved by the optical transparent resin. In addition, the optical transparent resin is cured after the cover plate is attached. Even if the optical transparent resin within the via hole contracts as it is cured, the small holes or gaps generated by the contraction can be filled up because of the optical transparent resin disposed outside the via hole. In this way, the via hole of the polarizing layer is filled once again, and thus the display panel is well supported, preventing the display panel from collapsing.

Specifically, during deployment of the optical transparent resin, ink printing is employed to form the optical transparent resin, for example. After ink printing of the optical transparent resin is applied to the first via hole in the polarizing layer, ink printing of the optical transparent resin continues on the polarizing layer outside the first via hole. Then, the cover plate is attached to the optical transparent resin, and the optical transparent resin is cured. Even if overflow of the optical transparent resin occurs in the attaching process and the curing process, the optical transparent resin can overflow all around without affecting the display module or affecting the flatness after attached. The optical transparent resin can fully fill up the via hole of the polarizing layer and support the display panel well. Moreover, because deployment of the adhering layer is needless, the number of manufacturing processes is reduced and the efficiency of manufacturing the display module is improved.

In an embodiment, the polarizing layer includes a polarizing sheet, the polarizing sheet forms the first via hole, the optical transparent resin covers the polarizing sheet and extends to being in the first via hole of the polarizing sheet, and a surface that the cover plate contacts with the optical transparent resin is a plane. When optical adhesive is disposed on the polarizing sheet, there will have a void in the area of blind hole, which causes collapse and deformation of the display panel. The optical transparent resin fills the first via hole and covers the polarizing sheet such that the optical transparent resin adheres the polarizing sheet to the cover plate. The surface that the optical transparent resin contacts with the optical transparent resin is a plane such that the display module has better flatness, thereby improving the flatness of the display module.

Figure 5:
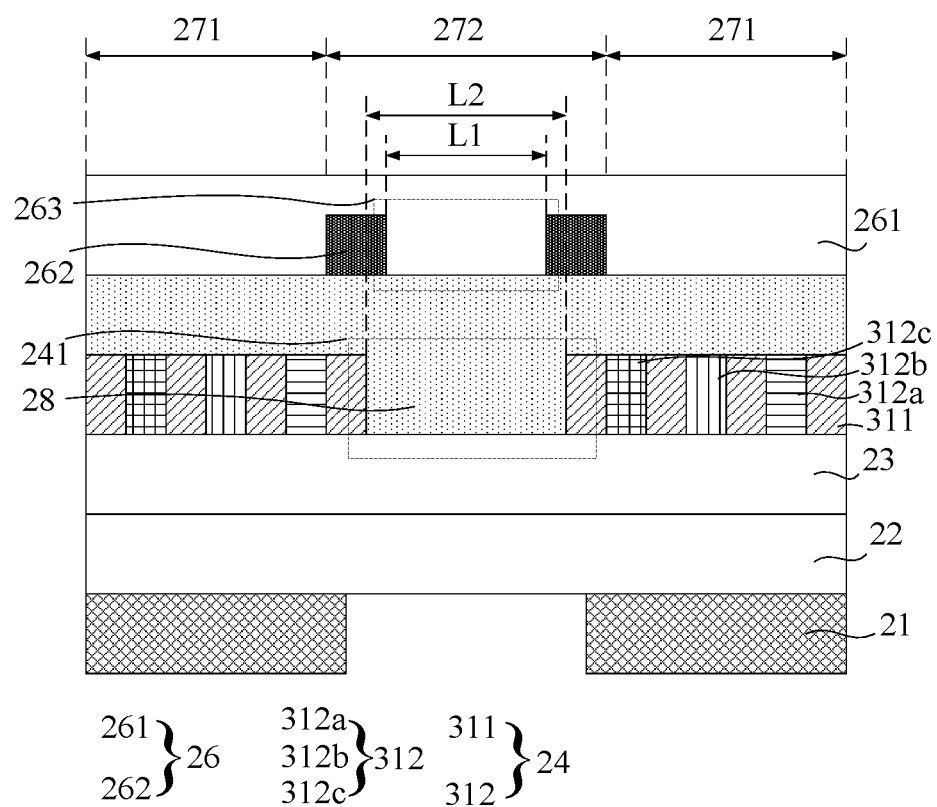
FIG. 5 is a schematic diagram illustrating a third type of a display module provided in an embodiment of the present application.

For a technique with no polarizing sheet, the blind hole area lacks of black matrix units as compared to the normal display area, and this will cause bubbles to be easily appear after the cover plate is attached. In an embodiment, as shown in FIG. 5, the polarizing layer 24 includes color resist units 312 and black matrix units 311, the color resist units 312 are disposed between the black matrix units 311, and in an area close to the electronic component disposing area 272, the black matrix units 311 are disposed at a side of the color resist units 312 close to the first via hole 241. When the display module employs the color resist units and the black matrix units as the polarizing layer, the segment difference between the electronic component disposing area and the normal display area is eliminated by using the optical transparent resin to fill up the first via hole of the polarizing layer and using the optical transparent resin to cover the color resist units and the black matrix units. This prevents bubbles occurred after the cover plate is attached, which may affect the display effect.

Specifically, as shown in FIG. 5, the color resist units include red color resist units 312c, green color resist units 312b and blue color resist units 312a. By using the red color resist units, the green color resist units, the blue color resist units and the black matrix units, the polarizing sheet can be replaced such that the thickness of the display module is reduced and light transmittance is improved.

Light leakage may occur in the blind hole area of the display module. In an embodiment, as shown in FIG. 5, the cover plate 26 includes a cover plate body 261 and an ink layer 262, the ink layer 262 is disposed between the cover plate body 261 and the polarizing layer 24, and the ink layer 262 forms a second via hole 263 in the electronic component disposing area 272. By disposing the ink layer and making the ink layer extend from the normal display area to the electronic component disposing area, it prevents light leakage from being occurred in the electronic component disposing area when the display panel emits light rays, and light rays can enter along the second via hole of the ink layer when electronic components are irradiated by external light rays such that the electronic components are well lighted.

In an embodiment, as shown in FIG. 5, a symmetrical axis of the second via hole 263 is as same as a symmetrical axis of the first via hole 241, and a width L1 of the second via hole 263 is less than a width L2 of the first via hole 241. By disposing the second via hole and the first via hole symmetrically and making the width of the second via hole smaller than the width of the first via hole, it prevents light rays from leaking from the electronic component disposing area after passing through the first via hole. When the electronic component disposing area is irradiated by external light rays, the light rays can enter from the first via hole after passing through the second via hole since the width of the first via hole is greater than the width of the second via hole, such that the electronic components are well lighted.

The ink layer may block light rays from emitting out normally, causing a poor display effect. In an embodiment, as shown in FIG. 5, the polarizing layer 24 includes color resist units 312 and black matrix units 311, the color resist units 312 are disposed between the black matrix units 311, and a gap exists between a projection of the color resist units 312 onto the display panel 23 and a projection of the ink layer 262 onto the display panel 23. By disposing the ink layer corresponding to the black matrix units, a gap exists between a projection of the color resist units onto the display panel and a projection of the ink layer onto the display panel such that there is no ink layer disposed above the color resist units. It prevents the ink layer from blocking the light rays passing through the color resist units such that the light rays from the display panel can be emitted out normally.

In an embodiment, as shown in FIG. 3, the display module further includes a complex layer 21, and the complex layer 21 is disposed at a side of the backplate 22 away from the display panel 23. By disposing the complex layer under the backplate to support the display panel and help heat dissipation, it prevents from being overheated, causing a poor display effect.

In an embodiment, the ratio of the thickness of the optical transparent resin to the thickness of the polarizing layer ranges from 1:1 to 2:1. The thickness of the optical transparent resin is greater than or equal to the thickness of the polarizing layer such that the optical transparent resin fully fills up the via hole of the polarizing layer.

In an embodiment, the curing rate of the optical transparent resin ranges from 94% to 99%.

In an embodiment, the aperture of the first via hole of the polarizing layer ranges from 1 mm to 3 mm. The difference between the aperture of the first via hole of the polarizing layer and the aperture of the second via hole ranges from 0.05 mm to 0.25 mm.

In an embodiment, the complex layer is provided with a third via hole in the electronic component disposing area, and a width of the third via hole is greater than a width of the first via hole. By making the complex layer form the third via hole in the electronic component disposing area, the light transmittance of the electronic component disposing area is improved. In addition, by making the width of the third via hole greater than the width of the first via hole, external light rays can pass through the third via hole after passing through the first via hole even though they are diverged, thereby improving the light transmittance.

In an embodiment, the complex layer includes a sticking layer, a buffer layer, a reinforcement layer and a heat dissipating layer, the sticking layer is disposed at a side of the backplate away from the display panel, the buffer layer is disposed at a side of the sticking layer away from the backplate, the reinforcement is disposed at a side of the buffer layer away from the sticking layer, and the heat dissipating layer is disposed at a side of the reinforcement layer away from the buffer layer. By disposing the sticking layer, adhering between the backplate and the complex layer is improved. The buffer layer, the reinforcement layer and the heat dissipating layer support the display panel and help heat dissipation. It prevents the display panel from being curved or overheated, causing a poor display effect.

It needs to be noted that the embodiments of the present application use the electronic component disposing area to define the blind hole area. The invention is not limited to whether the displaying functions well and how to carry out the displaying in the blind hole area. For example, the displaying is not performed in the electronic component disposing area when the electronic components work, and the displaying is performed in the electronic component disposing area when the electronic components stop working. Display content in this area may differ from normal display area or they are alternate.

An embodiment of the present application provides a method of manufacturing a display module. The method of manufacturing the display module includes:
- providing a display panel;
- binding a drive chip and a flexible circuit board onto the display panel and attaching a first protective film to the drive chip;
- attaching a polarizing sheet to the display panel and etching the polarizing sheet to form a first via hole;
- coating ultraviolet (UV)-cured adhesive on a binding area of the display panel;
- peeling off a glass substrate at the back of the display panel by laser;
- attaching a backplate to the back of the display panel;
- irregularly cutting the display panel;
- forming optical transparent resin in the first via hole of the polarizing sheet by ink printing;
- attaching a cover plate to the display panel;
- curing the optical transparent resin by UV light;
- attaching a second protective film to the display panel;
- attaching a complex film to the backplate; and
- bending the binding area to obtain a display module.

The embodiment of the present application provides a method of manufacturing a display module. In the method of manufacturing the display module, after a step of irregularly cutting the display panel, the optical transparent resin fills in the first via hole of the polarizing sheet, and after the cover plate is attached, the optical transparent resin is cured. In this way, the optical transparent resin can fully fill up the first via hole of the polarizing sheet, thereby preventing the display panel from being unable to be supported and being curved and deformed, caused when a void exists in the via hole of the polarizing sheet. In addition, curing the optical transparent resin after the cover plate is attached can prevent the cured optical transparent resin from being unable to fully fill up the via hole of the polarizing sheet, such that the supporting to the display panel is improved.

In an embodiment, when the display panel further includes optical adhesive, the method further includes attaching the optical adhesive to the polarizing sheet before the step of curing the optical transparent resin by ultraviolet light.

An embodiment of the present application provides a method of manufacturing a display module. The method of manufacturing the display module includes:
- providing a display panel with a polarizing layer disposed thereon, wherein the polarizing layer includes black matrix units and color resist units and is provided with a first via hole;
- binding a drive chip and a flexible circuit board onto the display panel and attaching a first protective film to the drive chip;
- coating ultraviolet (UV)-cured adhesive on a binding area of the display panel;
- peeling off a glass substrate at the back of the display panel by laser;
- attaching a backplate to the back of the display panel;
- irregularly cutting the display panel;
- forming optical transparent resin in the first via hole of the polarizing layer by ink printing;
- attaching a cover plate to the display panel;
- curing the optical transparent resin by UV light;
- attaching a second protective film to the display panel;
- attaching a complex film to the backplate; and
- bending the binding area to obtain a display module.

The embodiment of the present application provides a method of manufacturing a display module. In the method of manufacturing the display module, after a step of irregularly cutting the display panel, the optical transparent resin fills in the first via hole of the polarizing layer, and after the cover plate is attached, the optical transparent resin is cured. In this way, the optical transparent resin can fully fill up the first via hole of the polarizing layer, thereby preventing the display panel from being unable to be supported and being curved and deformed, caused when a void exists in the via hole of the polarizing sheet. Also, it prevents the displaying from being affected by bubbles that occur at the cover plate due to segment difference. In addition, curing the optical transparent resin after the cover plate is attached can prevent the cured optical transparent resin from being unable to fully fill up the via hole of the polarizing sheet, such that the supporting to the display panel is improved.

Figure 6:
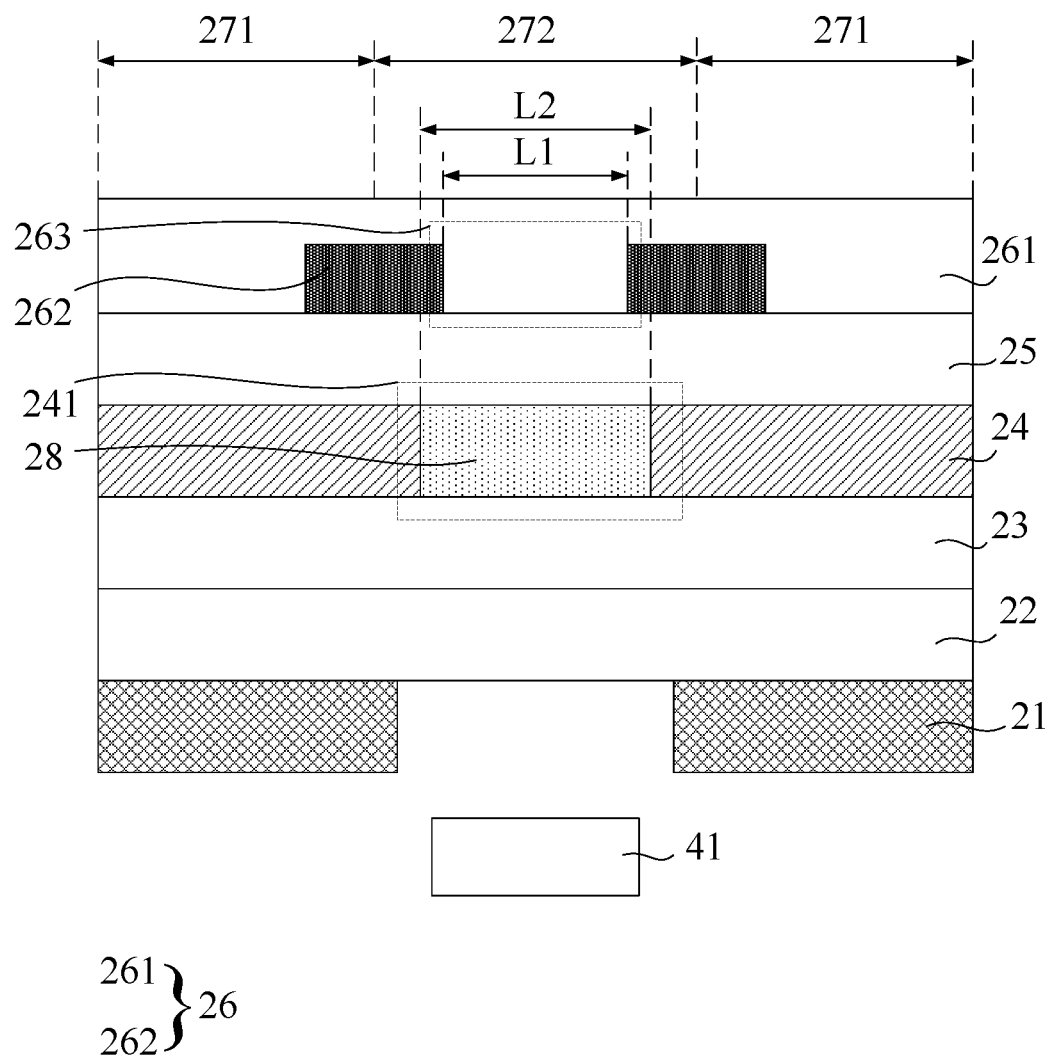
FIG. 6 is a schematic diagram illustrating a display device provided in an embodiment of the present application.

As shown in FIG. 6, the embodiments of the present application also provide a display device, which includes a display module and an electronic component 41. The display module includes:
- a backplate 22;
- a display panel 23, disposed at a side of the backplate 22;
- a polarizing layer 24, disposed at a side of the display panel 23 away from the backplate 22; and
- a cover plate 26, disposed at a side of the polarizing layer 24 away from the display panel 23,
- wherein the display module 2 includes a normal display area 271 and an electronic component disposing area 272 corresponding to a location where an electronic component is disposed, the polarizing layer 24 forms a first via hole 241 in the electronic component disposing area 272, the first via hole 241 is provided with optical transparent resin 28, and the optical transparent resin 28 is cured after the cover plate 26 and the polarizing layer 24 are attached to each other.

The embodiments of the present application provide a display device. The display device includes a display module and an electronic component. The display module is provided with the optical transparent resin in the first via hole of the polarizing layer, and the optical transparent resin is cured after the cover plate and the polarizing layer are attached to each other. In this way, the via hole of the polarizing layer is fully filled using the optical transparent resin in a fluid state before cured, preventing the display panel from collapsing due to a void in the via hole.

In an embodiment, the electronic component includes an under-display camera.

In an embodiment, in the display device, the display module further includes an adhering layer, wherein the adhering layer is disposed between the polarizing layer and the cover plate and covers the optical transparent resin.

In an embodiment, in the display device, a material of the adhering layer including optical adhesive, and the optical transparent resin is cured after the optical adhesive and the cover plate are attached to each other.

In an embodiment, in the display device, the optical transparent resin extends from being on the polarizing layer to being in the first via hole of the polarizing layer, and a projection of the optical transparent resin onto the display panel overlaps with a projection of the polarizing layer onto the display panel, and the optical transparent resin is cured after the cover plate is attached to the optical transparent resin.

In an embodiment, in the display device, the polarizing layer includes a polarizing sheet, the polarizing sheet forms the first via hole, the optical transparent resin covers the polarizing sheet and extends to being in the first via hole of the polarizing sheet, and a surface that the cover plate contacts with the optical transparent resin is a plane.

In an embodiment, in the display device, the polarizing layer includes color resist units and black matrix units, the color resist units are disposed between the black matrix units, and in an area close to the electronic component disposing area, the black matrix units are disposed at a side of the color resist units close to the first via hole.

In an embodiment, in the display device, the cover plate includes a cover plate body and an ink layer, the ink layer is disposed between the cover plate body and the polarizing layer, and the ink layer forms a second via hole in the electronic component disposing area.

In an embodiment, in the display device, a symmetrical axis of the second via hole is as same as a symmetrical axis of the first via hole, and a width of the second via hole is less than a width of the first via hole.

In an embodiment, in the display device, the polarizing layer includes color resist units and black matrix units, the color resist units are disposed between the black matrix units, and a gap exists between a projection of the color resist units onto the display panel and a projection of the ink layer onto the display panel.

In an embodiment, in the display device, the display module further includes a complex layer, and the complex layer is disposed at a side of the backplate away from the display panel.

In an embodiment, the complex layer is provided with a third via hole in the electronic component disposing area, and a width of the third via hole is greater than a width of the first via hole.

It can be known from above embodiments that:

The embodiments of the present application provide a display module and a display device. The display module includes a backplate, a display panel, a polarizing layer and a cover plate. The display panel is disposed at a side of the backplate. The polarizing layer is disposed at a side of the display panel away from the backplate. The cover plate is disposed at a side of the polarizing layer away from the display panel. The display module includes a normal display area and an electronic component disposing area corresponding to a location where an electronic component is disposed. The polarizing layer forms a first via hole in the electronic component disposing area. The first via hole is provided with optical transparent resin, and the optical transparent resin is cured after the cover plate and the polarizing layer are attached to each other. In the present application, the optical transparent resin is disposed in the first via hole of the polarizing layer, and the optical transparent resin is cured after a cover plate and the polarizing layer are attached to each other. In this way, the via hole of the polarizing layer is fully filled using the optical transparent resin in a fluid state before cured, preventing the display panel from collapsing due to a void in the via hole.

In the above embodiments, different emphasis is placed on respective embodiments, and reference may be made to related depictions in other embodiments for portions not detailed in a certain embodiment.

Hereinbefore, the display module and the display device provided in the embodiments of the present application are introduced in detail, the principles and implementations of the embodiments are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:

1. A display module, comprising: a backplate;
a display panel, disposed at a side of the backplate;
a layer, disposed at a side of the display panel away from the backplate; and
a cover plate, disposed at a side of the layer away from the display panel,
wherein the display module has a normal display area and an electronic component disposing area corresponding to a location where an electronic component is disposed, the layer is provided with a first via hole in the electronic component disposing area, the first via hole is fully filled with optical transparent resin, a surface of the layer away from the display panel is completely covered by the optical transparent resin, and the optical transparent resin is cured to support the display panel after the cover plate and the layer are attached to each other by the optical transparent resin functioning as an adhesive layer;
wherein the cover plate comprises a cover plate body and an ink layer disposed between the cover plate body and the layer, and the ink layer is provided with a second via hole in the electronic component disposing area; and
wherein the layer comprises a black matrix and a plurality of color resist units disposed in the black matrix, and an orthographic projection of each of the color resist units on the display panel does not overlap an orthographic projection of the ink layer on the display panel so that the ink layer does not block light transmitted through the color resist units.

2. The display module of claim 1, wherein a part of the black matrix is disposed at a side of one of the color resist units close to the first via hole.

3. The display module of claim 1, wherein the second via hole has a same symmetrical axis as the first via hole, and a width of the second via hole is less than a width of the first via hole.

4. A display device, comprising a display module and an electronic component, wherein the display module comprises:
a backplate;
a display panel, disposed at a side of the backplate;
a layer, disposed at a side of the display panel away from the backplate; and
a cover plate, disposed at a side of the layer away from the display panel,
wherein the display module has a normal display area and an electronic component disposing area corresponding to a location where the electronic component is disposed, the layer is provided with a first via hole in the electronic component disposing area, the first via hole is fully filled with optical transparent resin, a surface of the layer away from the display panel is completely covered by the optical transparent resin, and the optical transparent resin is cured to support the display panel after the cover plate and the layer are attached to each other by the optical transparent resin functioning as an adhesive layer;
wherein the cover plate comprises a cover plate body and an ink layer disposed between the cover plate body and the layer, and the ink layer is provided with a second via hole in the electronic component disposing area; and wherein the layer comprises a black matrix and a plurality of color resist units disposed in the black matrix, and an orthographic projection of each of the color resist units on the display panel does not overlap an orthographic projection of the ink layer on the display panel so that the ink layer does not block light transmitted through the color resist units.

5. The display device of claim 4, wherein a part of the black matrix is disposed at a side of one of the color resist units close to the first via hole.

6. The display device of claim 4, wherein the second via hole has a same symmetrical axis as the first via hole, and a width of the second via hole is less than a width of the first via hole.

7. The display device of claim 4, wherein the display module further comprises a complex layer, and the complex layer is disposed at a side of the backplate away from the display panel to support the display panel and help heat dissipation of the display panel.

8. The display device of claim 7, wherein the complex layer is provided with a third via hole in the electronic component disposing area, and a width of the third via hole is greater than a width of the first via hole.

* * * * *